(12) United States Patent
Yakushiji et al.

(10) Patent No.: US 7,498,184 B2
(45) Date of Patent: Mar. 3, 2009

(54) PRODUCTION METHOD FOR SEMICONDUCTOR DEVICE

(75) Inventors: Kenji Yakushiji, Ichihara (JP); Katsuki Kusunoki, Ichihara (JP); Hisayuki Miki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 378 days.

(21) Appl. No.: 10/580,107

(22) PCT Filed: Oct. 5, 2005

(86) PCT No.: PCT/JP2005/018731

§ 371 (c)(1),
(2), (4) Date: May 19, 2006

(87) PCT Pub. No.: WO2006/038713

PCT Pub. Date: Apr. 13, 2006

(65) Prior Publication Data

US 2007/0148803 A1    Jun. 28, 2007

Related U.S. Application Data

(60) Provisional application No. 60/618,583, filed on Oct. 15, 2004.

(30) Foreign Application Priority Data

Oct. 7, 2004    (JP) .............................. 2004-294934

(51) Int. Cl.
*H01L 21/00* (2006.01)
(52) U.S. Cl. ..................... 438/22; 438/48; 257/E21.117
(58) Field of Classification Search ................... 438/22, 438/33, 42, 88; 257/E21.117
See application file for complete search history.

(56) References Cited

U.S. PATENT DOCUMENTS 6,468,347 B1 * 10/2002 Motoki et al. ................. 117/89

FOREIGN PATENT DOCUMENTS

| EP | 1 376 687 A2 | 1/2004 |
|---|---|---|
| JP | 56-129340 | 10/1981 |
| JP | 63-145608 | 9/1988 |
| JP | 1-214010 | 8/1989 |
| JP | 3-209744 | 9/1991 |
| JP | 7-99345 | 4/1995 |
| JP | 9-82587 | 3/1997 |
| JP | 2001-77056 | 3/2001 |
| JP | 2002-359402 | 12/2002 |
| JP | 2001-151921 | 5/2003 |
| JP | 2004-31526 | 1/2004 |

* cited by examiner

*Primary Examiner*—Hoai v Pham
(74) *Attorney, Agent, or Firm*—Sughrue Mion, PLLC

(57) ABSTRACT

An object of the present invention is to provide a method of producing a Group III nitride semiconductor device having a chip form which is pentagonal or more highly polygonal maintaining good area efficiency and at a low cost.

The inventive method of producing a Group III nitride semiconductor device having a chip shape which is a pentagonal or more highly polygonal shape comprises a first step of epitaxially growing a Group III nitride semiconductor on a substrate to form a semiconductor wafer; a second step of irradiating said semiconductor wafer with a laser beam to form separation grooves; a third step of grinding and/or polishing the main surface side differently from the epitaxially grown main surface of the substrate; and a fourth step of division into individual chips by applying stress to said separation grooves.

16 Claims, 5 Drawing Sheets

A1  A2

D

PRODUCTION METHOD FOR SEMICONDUCTOR DEVICE

CROSS REFERENCE TO RELATED APPLICATION

This application is an application filed under 35 U.S.C. §111 (a) claiming benefit, pursuant to 35 U.S.C. §119 (e) (1), of the filing date of the Provisional Application No. 60/618, 583 filed on Oct. 15, 2004, pursuant to 35 U.S.C. §111 (b).

TECHNICAL FIELD

The present invention relates to a method of producing a semiconductor device. More specifically, the invention relates to a method of producing a semiconductor chip having a pentagonal or more highly polygonal chip form (hereinafter referred to as "polygonal chip").

BACKGROUND ART

A step of producing semiconductor devices by cutting a Group III nitride semiconductor wafer having an n-type layer, an active layer and a p-type layer stacked on an insulating substrate such as sapphire into chips, includes a step of forming separation grooves in a chip form by exposing the n-type layer to etching, a step of polishing the substrate to decrease its thickness, a step of exposing the substrate by introducing the diamond blade of a dicing saw into the separation grooves, a step of forming a scribe line along the trace for dicing by using a diamond blade of a scriber, and a step of obtaining chips by pushing and dividing the substrate, as disclosed in, for example, Japanese Patent Application Laid-Open {kokai} No. 5-343742.

Japanese Patent Application Laid-Open (kokai) No. 11-354841 discloses a step of cutting and separating, including a step of forming separation grooves in a chip form by exposing the n-type layer by etching, a step of polishing the substrate to decrease its thickness, a step of exposing the substrate by introducing the diamond blade of a dicing saw into the separation grooves, a step of forming a scribe line from the back surface side of the substrate at a position corresponding to the dicing line by using a scriber, and a step of obtaining chips by pushing and dividing the substrate.

It has been described that the sapphire substrate and the Group III nitride semiconductor layer are hard and cannot be divided into chips by cleavage unlike GaAs and GaP and, hence, the thickness of the substrate must have been decreased, before dividing it into chips, so as to make it more easily divided, and that stress-concentrating portions must be formed for dividing, or that dicing or scribing is necessary to locally decrease the thickness to accomplish the division at desired positions. The diamond blade of the dicing saw is usually in the shape of a disk which is dedicated to linear machining, and is not capable of effecting polygonal machining or curved machining. Even a method of forming a marking-off line on the Group III nitride semiconductor layer or on a sapphire substrate, by a dicing saw with a diamond blade, is substantially linear machining because the work to be machined has a hardness comparable to the hardness of the machining material, and it is difficult to accurately form a marking-off line in the form of a polygonal line or in the form of a curve. Therefore, the chip form of the conventional Group III nitride semiconductor device was of a square form.

In the Group III nitride semiconductor light-emitting device, on the other hand, light emitted from the active layer travels to go out of the Group III nitride semiconductor light-emitting device but cannot go out from the surface of the chip due to the relationship of the refractive index and the light is reflected and is absorbed by the Group III nitride semiconductor, by the sapphire substrate or by the electrode metal, and is converted into heat. The ratio of light going out of the chip is called light extraction efficiency. The light extraction efficiency at the end of the chip is greater when the chip is of a polygonal form than when it is of a square form, and becomes a maximum when the chip is of a circular form. This is because the conditions for perpendicular incidence on the end surfaces from the center of the chip consist of four conditions in the case of a square form, six conditions in the case of a hexagonal form and perpendicular incidence is permitted under every condition of 360 degrees in the case of a circular form. Therefore, the light extraction efficiency on the end surfaces of the chip can be improved in the case of the hexagonal chip as compared to the square chip.

Japanese Patent Application Laid-Open (kokai) No. 9-082587 discloses a method of producing a hexagonal chip by using a conventional machining technology. Referring to FIG. 4 of this patent document, the chips are divided by forming separation grooves which are linear machining lines in a manner that triangles and hexagons neighbor each other. That is, triangular portions are rounded off to obtain hexagonal chips. Japanese Patent Application Laid-Open {kokai} No. 2000-164930 discloses the arrangement of electrodes of the Group III nitride semiconductor light-emitting device of a hexagonal form. However, this patent document is quite silent about the method of producing the hexagonal chip.

In recent years, there has been developed a device for forming separation grooves for cutting chips by using a laser beam as disclosed in, for example, U.S. Pat. No. 6,413,839. The laser beam can be used not only to simply substitute for the conventionally employed dicing saw or the scriber but also is a machining technology that offers unknown probability which may realize a machining method that could not be accomplished by conventional methods. For example, Japanese Patent Application Laid-Open {kokai} No. 10-044139 discloses a technology for cutting by irradiating the bottoms of the separation grooves that have been formed in advance with a laser beam to cause a local thermal expansion. The laser beam is not only the heating means but also is capable of forming separation grooves having any depth or width by controlling the diameter of the beam, position of the focal point thereof, laser output and irradiation time. As an example, Japanese Patent Application Laid-Open {kokai} No. 11-163403 discloses a technology for forming separation grooves in the surface of the side opposite to the surface irradiated with the laser beam.

A polygonal chip has a number of sides greater than that of the conventional square chips and, hence, for example, a light-emitting device features an improved light extraction efficiency at the end surfaces of the chip. According to the conventional method of producing a hexagonal chip as described above, a triangular chip and a hexagonal chip are obtained by linearly forming the machining lines by using a dicing saw or by a scribing method. According to this method, however, the areas of the triangular shape are lost, and the area efficiency becomes poor. The light-emitting device of a polygonal chip can be expected to provide a high brightness. According to the conventional method of machining the polygonal chip, however, a problem remains in regard to a large machining loss and a poor area efficiency.

According to a laser machining method, a Group III nitride semiconductor or sapphire substrate is removed from the semiconductor surface side or the sapphire substrate side of the Group III nitride semiconductor device by sublimation from a portion irradiated with a laser beam which has a beam diameter of an order of microns, and there can be formed separation grooves which are deeper and narrower than that formed by the dicing method within short periods of time. However, if the substrate being machined is warping, the position of focal point of the laser beam undergoes a relative change, and the width and depth of the separation groove vary. A method can be contrived to control the position of the focal point to meet the warping by measuring the warping of the substrate in advance. In many cases, however, the shape of warping varies as the machining by laser proceeds, and a machining precision is not obtained for forming separation grooves of the order of microns in the whole surface of the substrate. To accomplish the laser machining maintaining high precision, therefore, the warping of the sapphire substrate to be machined must be decreased.

DISCLOSURE OF INVENTION

It is an object of the present invention to provide a method of producing a Group III nitride semiconductor device, having a chip form which is pentagonal or more highly polygonal, to solve the above-mentioned problems and maintain good area efficiency and at a low cost.

The present inventors have keenly endeavored to solve the above problems and have arrived at the present invention. Namely, the present invention provides the following:

1. A method of producing a Group III nitride semiconductor device having a chip shape which is a pentagonal or more highly polygonal shape, comprising a first step of epitaxially growing a Group III nitride semiconductor on a substrate to form a semiconductor wafer; a second step of irradiating said semiconductor wafer with a laser beam to form separation grooves; a third step of grinding and/or polishing the main surface side different from the epitaxially grown main surface of the substrate; and a fourth step of division into individual chips by applying a stress to said separation grooves.

2. A method of producing a Group III nitride semiconductor device according to 1 above, wherein the first step, the second step, the third step and the fourth step are included in this order.

3. A method of producing a Group III nitride semiconductor device according to 1 or 2 above, further including a fifth step of forming trenches, in which at least the n-type layer is exposed, corresponding to the positions for forming the separation grooves.

4. A method of producing a Group III nitride semiconductor device according to 3 above, wherein the fifth step exists before the second step.

5. A method of producing a Group III nitride semiconductor device according to 3 above, wherein the fifth step exists after the second step.

6. A method of producing a Group III nitride semiconductor device according to any one of 1 to 5 above, wherein the second step irradiates a laser beam from the semiconductor side of the semiconductor wafer.

7. A method of producing a Group III nitride semiconductor device according to any one of 1 to 6 above, wherein the separation grooves at least partly reach the substrate.

8. A method of producing a Group III nitride semiconductor device according to any one of 1 to 7 above, wherein the second step irradiates a laser beam from the substrate side of the semiconductor wafer.

9. A method of producing a Group III nitride semiconductor device according to 8 above, wherein the second step comprises a step of irradiating a laser beam from the semiconductor side of the semiconductor wafer and a step of irradiating a laser beam from the substrate side of the semiconductor wafer.

10. A method of producing a Group III nitride semiconductor device according to any one of 1 to 9 above, wherein the separation grooves have a V-shape in cross section.

11. A method of producing a Group III nitride semiconductor device according to any one of 1 to 10 above, wherein the second step forms a separation groove of the form of a polygonal line that is bent, forms a plurality of separation grooves, of the form of a polygonal line that is bent, in a form of being translated in parallel and, then, forms linear separation grooves by connecting every other bending point of the neighboring separation grooves in the form of a polygonal line.

12. A method of producing a Group III nitride semiconductor device according to any one of 1 to 10 above, wherein the second step forms first separation grooves of the form of a broken line, forms second separation grooves of the form of a broken line that intersect the first separation grooves of the form of the broken line at a first angle, and forms third separation grooves of the form of a broken line that intersect the second separation grooves of the form of the broken line at a second angle and further intersect the first separation grooves of the form of the broken line at a third angle, the sum of the first angle, the second angle and the third angle being 180 degrees.

13. A method of producing a Group III nitride semiconductor device according to any one of 1 to 12 above, wherein the semiconductor wafer is ground and/or polished at the third step to be not thicker than 150 μm.

14. A method of producing a Group III nitride semiconductor device according to any one of 1 to 13 above, wherein the fourth step is executed by pushing the substrate onto a spherical metal mold.

15. A method of producing a Group III nitride semiconductor device according to any one of 1 to 14 above, wherein the chip shape is substantially an orthohexagonal shape.

16. A method of producing a Group III nitride semiconductor device according to any one of 1 to 14 above, wherein the chip shape is substantially a pentagonal shape.

17. A method of producing a Group III nitride semiconductor device according to 16 above, wherein the second step forms separation grooves of a hexagonal shape by forming separation grooves of the form of a polygonal line that is bent, forming separation grooves of the form of a plurality of polygonal lines that are bent in a form of being translated in parallel and, then, forming linear separation grooves by connecting every other bending point of the neighboring separation grooves of the form of polygonal lines and, further, forms linear separation grooves connecting the opposing two sides of the separation grooves of said hexagonal form.

18. A method of producing a Group III nitride semiconductor device according to 16 above, wherein the second step forms separation grooves of the form of a hexagonal shape by forming first separation grooves of the form of a broken line, forming second separation grooves of the form of a broken line that intersect the first separation grooves of the form of the broken line at a first angle, and forming third separation grooves of the form of a broken line that intersect the second separation grooves of the form of the broken line at a second angle and, further, intersect the first separation grooves of the form of the broken line at a third angle, the sum of the first angle, the second angle and the third angle being 180 degrees and, further, forms linear separation grooves connecting the opposing two sides of the separation grooves of said hexagonal form.

19. A method of producing a Group III nitride semiconductor device according to any one of 1 to 10, 13 and 14 above, wherein the chip is substantially of a circular form.

20. A method of producing a Group III nitride semiconductor device according to any one of 1 to 19 above, wherein the Group III nitride semiconductor device is a light-emitting device.

21. A method of producing a Group III nitride semiconductor device according to 20 above, wherein the first step forms the semiconductor wafer by epitaxially growing an n-type layer, a light-emitting layer and a p-type layer comprising the Group III nitride semiconductor in this order on the substrate.

22. A Group III nitride semiconductor light-emitting device produced by a production method of 20 or 21 above.

23. A lamp comprising a light-emitting device of 22 above.

24. A lamp according to 23 above, wherein a light energy conversion material is arranged more at the end portion than at the center of a semiconductor chip forming a light-emitting device.

The present invention makes it possible to obtain a semiconductor light-emitting device having a chip form which is pentagonal or more highly polygonal and, particularly, a group III nitride semiconductor light-emitting device featuring excellent light extraction efficiency on the end surfaces of the chip and maintaining a good area efficiency over the whole semiconductor wafer surfaces at a low cost.

BEST MODE FOR CARRYING OUT THE INVENTION

Figure 1:
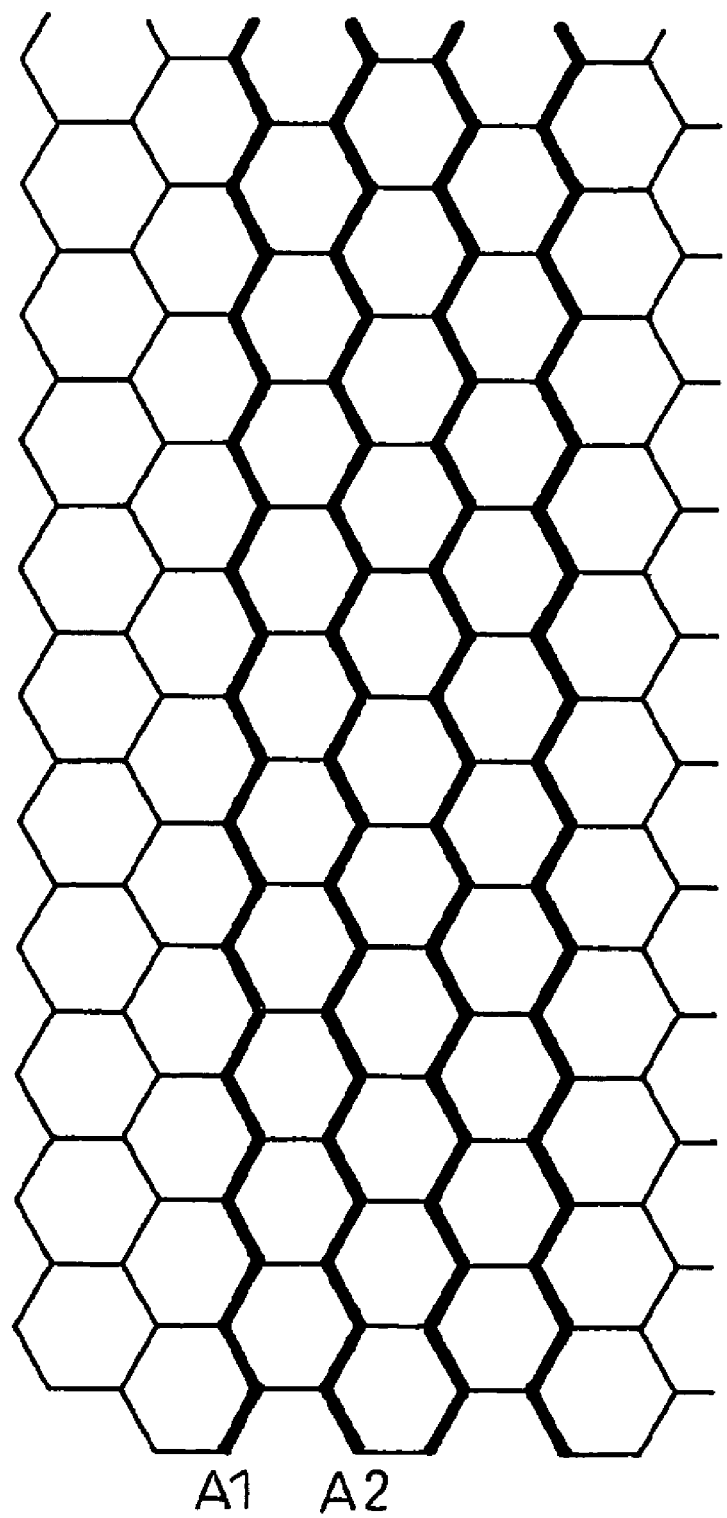
FIG. 1 is a diagram illustrating a procedure for forming separation grooves of hexagonal chips.

The invention will now be described concerning chiefly a semiconductor light-emitting device, though the invention is in no way limited thereto.

In the present invention, there is no particular limitation on the pentagonal or more highly polygonal form if it has 5 or more corners. The polygonal form includes, for example, the ones having 5 to 10 corners. Even a circle which is the ultimate polygon is included in the polygonal form having 5 or more corners of the present invention.

Among the polygonal chips having a good light extraction efficiency at the ends of the chip as compared to the conventional square chips, the form which permits the least machining loss is a hexagonal chip form of honeycomb-shaped separation grooves for dividing the chips in the surface of the semiconductor wafer or in the surface of the substrate. A pentagonal chip obtained by further adding a separation groove so as to divide the hexagonal chip into two, too, has a decreased machining loss though the light extraction efficiency drops to some extent. A circular chip that can be put into practice by the invention has a large machining loss but has a maximum light extraction efficiency on the end surfaces of the chip.

In the first step of the invention, it is desired to use a sapphire substrate or an SiC substrate for growing the Group III nitride semiconductor. As the substrate, there can be further used a glass substrate, an oxide substrate such as $MgAl_2O_4$, $ZnO$, $LiAlO_2$, $LiGaO_2$ or $MgO$, a silicon substrate, a GaAs substrate and a GaN substrate without any limitation. Examples appearing later deal with a sapphire substrate having a very weak cleaving property. However, fabrication of a polygonal chip by using a substrate having a strong cleaving property, such as a silicon substrate or a GaAs substrate, requires cutting even in a direction of a weak cleaving property. Therefore, the present invention is effective in cutting such substrates, too.

For example, a semiconductor wafer is obtained by epitaxially growing an n-type layer, a light-emitting layer and a p-type layer by the MOCVD method on the substrate via, usually, a buffer layer. The buffer layer is not often needed depending upon the substrate that is used and the conditions for growing the epitaxial layer.

As the Group III nitride semiconductor constituting the n-type layer, light-emitting layer and p-type layer, there have been known many Group III nitride semiconductors represented by, for example, the formula $Al_xIn_yGa_{1-x-y}N$ ($0 \leq x \leq 1$, $0 \leq y \leq 1$, $x+y \leq 1$). In the present invention, too, there can be used the Group III nitride semiconductors represented by the formula $Al_xIn_yGa_{1-x-y}N$ ($0 \leq x \leq 1$, $0 \leq y \leq 1$, $x+y \leq 1$) inclusive of known compound semiconductors without any limitation.

There is no particular limitation on the method of epitaxially growing the Group III nitride semiconductor, and there can be employed any known method such as MOCVD (organometal chemical vapor deposition), HVPE (hydride vapor growing method) and MBE (molecular ray epitaxial method). A preferred growing method is an MOCVD method from the standpoint of controlling the film thickness and mass production. In the MOCVD method, the carrier gas may be hydrogen ($H_2$) or nitrogen ($N_2$), the Ga source which is a Group III starting material may be trimethylgallium (TMG) or triethylgallium (TEG), the Al source may be trimethylaluminum (TMA) or triethylaluminum (TEA), the In source may be trimethylindium (TMI) or triethylindium (TEI), the N source which is a Group V starting material may be ammonia ($NH_3$) or hydrazine ($N_2H_4$). As for the dopants, there are used a monosilane ($SiH_4$) or a disilane ($Si_2H_6$) as the starting Si material and a german ($GeH_4$) or an oganogermanium compound as the starting Ge material for the n-type, and a biscyclopentadienylmagnesium ($Cp_2Mg$) or a bisethylcyclopentadienylmagnesium (($EtCp)_2Mg$) as the starting Mg material for the p-type.

On the semiconductor wafer formed in the first step, an n-electrode and a p-electrode are further formed on an n-type layer and a p-type layer, respectively. The electrodes, however, may be formed after the end of the second step. There have been known n-electrodes and p-electrodes of various compositions and structures, and the present invention may use any kinds of them inclusive of the known ones.

To form the surface for forming the n-electrode, the n-type layer is exposed by removing the p-type layer and the light-emitting layer by, for example, dry etching. At this moment, the positions for dividing the chips (i.e., the positions for forming the separation grooves), too, are etched to expose the n-type layer, and trenches that will be described later may be formed, simultaneously, by dry etching.

It is desired that the surface for forming the n-electrode is formed on one corner in the case of a hexagonal chip. The size of the n-electrode is the same as that of the conventional square chip. The p-electrode may be a light-transmitting electrode or a reflecting electrode. That is, the chip may be either of a face-up structure or a flip-chip structure. In the case of the light-transmitting electrode, it is desired that the bonding pad is formed on another corner facing the surface for forming the n-electrode. The n-electrode forming surfaces may be formed at a plurality of corners, on the hexagonal sides extending the n-electrodes like twigs, or may be formed along the sides. An insulating film such as a silicon oxide film may be formed on the surface of the chip to avoid a short circuit between the n-electrode and the p-type layer or the p-electrode.

The semiconductor wafer formed through the first step is put through the second to fourth steps so as to be divided into individual chips.

In the second step, the semiconductor layer is irradiated with a laser beam at a predetermined position (separation zones for division into individual chips) to form separation grooves of a depth which desirably reaches the substrate. The separation grooves, however, need not necessarily reach the substrate. This is not necessary particularly when the separation grooves are formed in the back surface of the substrate (surface on where no semiconductor is epitxially grown), too, as will be described later.

There is no particular limitation on the width of the separation groove if it can be held in the separation zone. When a trench that will be described later has been formed in advance, the trench is irradiated with a laser beam to form a separation groove having a width narrower than that of the trench and having a depth which desirably reaches the substrate. The depth of the separation groove is desirably about 20 µm to about 50 µm though it may vary depending upon the thickness of the substrate after ground.

The separation grooves may have any shape in cross section but desirably have a V-shape. Upon forming the separation grooves of the V-shape, stress concentrates in the bottom portions of the separation grooves enabling the chips to be easily divided. Smooth and neat chip-dividing surfaces are obtained when the separation grooves are formed with a laser beam. This is presumably due to a thermally affected portion being formed from the bottoms of the separation grooves into the interior of the substrate facilitating the division of the chips. The depth of the thermally affected portions increases as the separation grooves are formed in a sharp V-shape with the laser beam.

The separation grooves can be formed on the back surface of the substrate by irradiating the back surface of the substrate (surface where no semiconductor is epitaxially grown) with a laser beam. The separation grooves may be formed on either the semiconductor side or the back surface side of the substrate. When formed on both sides, however, division of the chips is facilitated and, besides, light is extracted in increased amounts through the separation grooves to further improve the light extraction efficiency. The shape of the separation grooves in the back surface of the substrate is, desirably, a V-shape but may be a U-shape instead.

The shape of the separation groove can be controlled by, for example, varying the focusing position of the laser beam. In general, when the focusing position is separated, the width of the separation groove is broadened to approach that of he U-shape. A multiplicity of laser beams may be irradiated to adjust the shape of the separation grooves.

The laser machining apparatus that can be used in the present invention may be of any type provided it is capable of forming separation grooves for dividing the semiconductor wafer into the individual chips, and has a computer-controlled stage for placing the semiconductor wafer. Concretely, there can be used a $CO_2$ layer, a YAG laser or an excimer laser. The laser oscillation system may be either a continuous oscillation or a pulse oscillation. When the trench is irradiated with a laser beam from the side of the semiconductor layer, the beam must be made as fine as possible. It is, therefore, desired that the apparatus is capable of emitting a fine beam.

The laser beam may have a wavelength of 355 nm or 266 nm, or may have a further short wavelength. The frequency is, preferably, 1 to 100,000 Hz and, more preferably, 30,000 to 70,000 Hz. The output is, desirably, a minimum output necessary for obtaining desired separation grooves though it may vary depending upon the width and depth of the separation grooves. An excess of laser output may cause thermal damage to the substrate and the compound semiconductor. Therefore, the above minimum output is, usually, not larger than 2 W and, more desirably, not larger than 1 W.

The present invention can include a fifth step of forming, in advance, trenches for exposing the n-type layer at positions (separation zones) where the chips are to be divided, i.e., at positions where the separation groove are formed. Upon forming the separation grooves in the trenches by laser machining, the active layer and the p-type layer are prevented from being damaged by the laser machining, and a further preferred embodiment is obtained as compared to when no trench is formed, in advance, at the positions where the chips are to be separated. Conversely, the trenches may be formed after the separation grooves are formed. In this case, there is obtained an advantage in that the contamination is removed from the side surfaces of the separation grooves formed by the laser machining.

The trench is desirably formed by etching such as wet etching or dry etching. This is because the etching does not damage the surfaces and the side surfaces of the compound semiconductor. The dry etching may employ such means as reactive ion etching, ion milling, focused beam etching or ECR etching, and the wet etching may use a mixed acid of, for example, sulfuric acid and phosphoric acid.

It is desired that the trenches have at least the n-type layer that is exposed, and can be simultaneously formed when the surface for forming the n-electrode is exposed as described above since this enables the step to be simplified. The trenches may have any shape in cross section, such as rectangular shape, U-shape or V-shape. However, the rectangular shape is desired for forming the separation grooves on the bottom surface.

Figure 2:
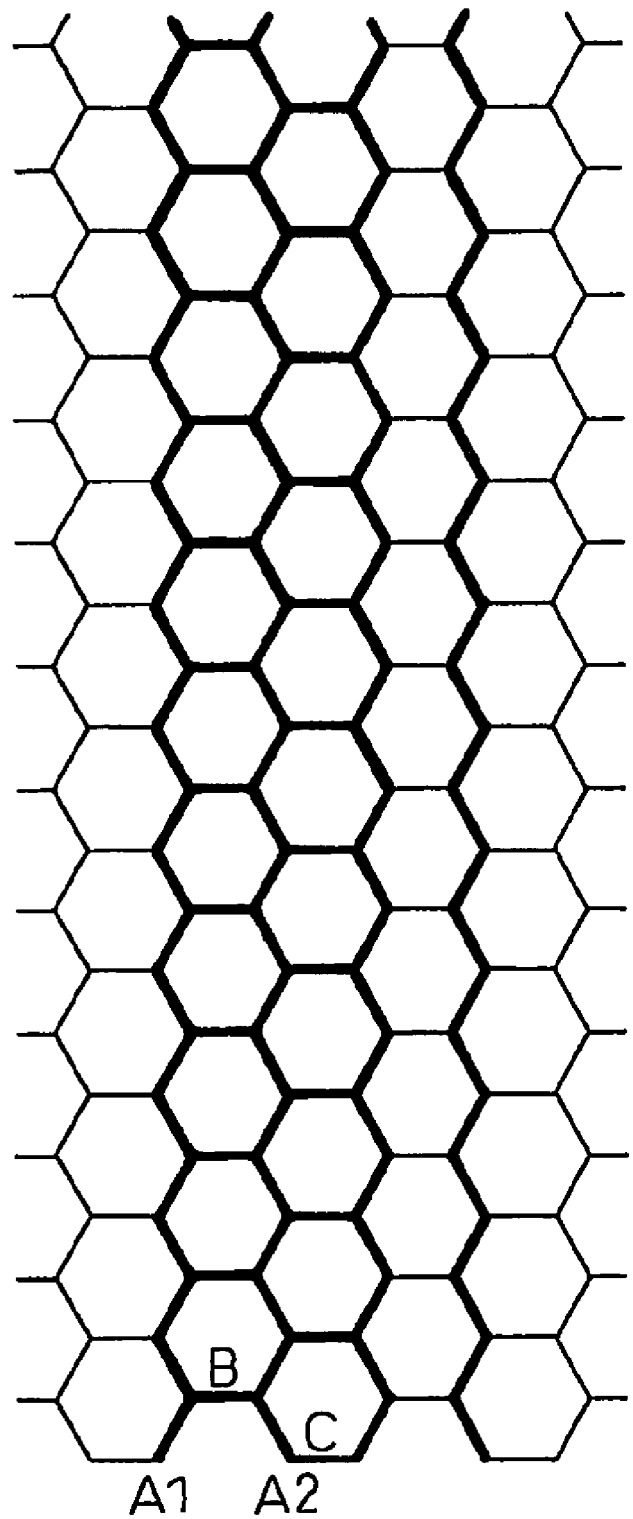
FIG. 2 is another diagram illustrating a procedure for forming separation grooves of hexagonal chips.

A method of scribing separation grooves so as to obtain a chip of a polygonal form, such as an orthohexagonal form comprises, as shown in FIG. 1, forming separation grooves of the form of a polygonal line by, first, irradiating a polygonal line (A1) having sides of the same length and having bending points bending at, for example, 120 degrees with a laser beam so as to traverse the semiconductor wafer. Thereafter, separation grooves are newly formed having the form of a polygonal line (A2) which is a parallel translation from the polygonal line (A1). The parallel translation is repeated to form separation grooves of the form of the polygonal line over the whole surface of the semiconductor wafer. Referring next to FIG. 2, every other bending point of the polygonal line are selected and are connected to the bending points of the neighboring polygonal line that is translated in parallel thereby to form linear separation grooves (B). Thereafter, the bending points that were not selected are connected to the bending points of the neighboring polygonal line translated in parallel to the side opposite to the above polygonal line that was translated in parallel, thereby to form linear separation grooves (C). Thus, there are formed separation grooves of a honeycomb hexagonal chip form on a semiconductor wafer. To obtain a pentagonal chip, further, a linear separation groove may be further formed as represented by a straight line (D) in FIG. 3.

To obtain the hexagonal chip, further, there is a method of forming separation grooves of an orthohexagonal shape by forming separation grooves of the form of a broken line that are formed in three directions by being turned by 60 degrees, respectively. This method is shown in FIG. 4. In a first direction, there are formed separation grooves (E) of the form of a broken line discretely forming the separation grooves like a broken line having a length same as the length of a side of the hexagonal chip form. Next, the stage is turned by 60 degrees. There are formed separation grooves (F) of the form of a broken line having the length same as the length of a side of the hexagonal chip form starting from the ends of the separation grooves (E) of the form of a broken line in the first direction, thereby to form separation grooves of the form of a broken line in a second direction. Next, the stage is further turned by 60 degrees. There are formed separation grooves (G) of the form of a broken line having the length same as the length of a side of the hexagonal chip form starting from the ends of the separation grooves (F) of the form of a broken line in the second direction, thereby to form separation grooves of the form of a broken line in a third direction. Thus, there are formed separation grooves for obtaining honeycomb hexagonal chip forms on the semiconductor wafer. To obtain a pentagonal chip, a linear separation groove may be further formed as represented by a straight line (D) in FIG. 3. The procedure for forming the separation grooves for obtaining the honeycomb hexagonal chip form is not limited to the above-mentioned procedure or method only. Further, the form need not necessarily be an orthohexagonal form but may be any hexagonal form by varying the angle of the polygonal line or by varying the rotational angle of the broken lines in three directions.

If these complex groove forms are not precisely applied to the whole semiconductor wafer, the depth of separation grooves and the width of separation grooves partly undergo variation causing the occurrence of such defects as cutting-away and scars when divided into chips. To scribe the separation grooves maintaining good precision on the whole semiconductor wafer, it is necessary to decrease the warping of the semiconductor wafer to maintain constant as much as possible the focusing of the laser beam relative to the surface of the wafer over the whole wafer. A method may be to utilize an automatic focusing position control function that is incorporated in the laser machining apparatus itself. In many cases, however, the shape of warping varies as the laser machining proceeds. Basically, therefore, it is important to minimize the warping of the semiconductor wafer to be irradiated with a laser beam. Upon forming the separation grooves by machining the semiconductor wafer free of warping with a laser beam, there are formed separation grooves having stable widths and depths in the whole semiconductor wafer.

A semiconductor wafer epitaxially growing a thin film on the substrate is in many cases more warped than the substrate on which no film is epitaxially grown. The substrate having an increased thickness is warped less after a film is epitaxially grown thereon. However, too large a thickness drives up the cost. Therefore, to obtain a stable epitaxial film without developing warping during the epitaxial growing, the substrate, usually, should have a thickness of about 350 μm to about 450 μm. When the effect of warping appears conspicuously due to a thick epitaxial film, there is often used a sapphire substrate having a thickness which is further increased to about 600 μm. This, however, does not hold when the warping of the semiconductor wafer is controlled such as using a substrate of the same kind as the epitaxial film deposited on the upper side like a GaN substrate or using a substrate that has been warped in advance.

In the third step of the invention, it is desired that the back surface of the substrate having the above-mentioned thickness is ground and/or polished to decrease the thickness of the semiconductor wafer to about 150 μm. The smaller the final thickness after the grinding and/or the polishing, the smaller the probability of causing scars to the end surfaces of the chips when they are being divided and, further, making it possible to obtain polygonal chips even without relying upon a special chip-dividing method. Conversely, when the final thickness of the semiconductor wafer becomes too small, the semiconductor wafer is warped making it difficult to be divided into the chips and often causing the semiconductor wafer to be damaged when the back surface is being machined giving rise to the occurrence of a defect such as cracking. The thickness is desirably not larger than about 120 μm, more desirably, not larger than about 100 μm and, further desirably, not larger than about 85 μm. The lower limit is, preferably, not smaller than about 40 μm and, more preferably, not smaller than about 60 μm.

When the substrate is ground and/or polished so as to be easily divided into the chips, the strength of the substrate is reduced and the warping increases. Therefore, this step of decreasing the thickness of the semiconductor wafer by grinding and/or polishing the back surface side of the substrate, is better effected after the step of forming the separation grooves. When the separation grooves are to be formed in the back surface of the substrate, however, it is desired that the grinding is effected prior to forming the separation grooves from the standpoint of maintaining precision. When the separation grooves are to be formed on both sides, i.e., on the semiconductor side of the semiconductor wafer and on the back surface side of the substrate, the separation grooves are formed in the semiconductor side, first, followed by the grinding and/or the polishing and, thereafter, the separation grooves are formed again in the back surface side of the substrate.

Further, if the separation grooves are formed having a depth reaching the substrate, the warping of the semiconductor wafer as a whole can be decreased, which is further desirable. This is because the thin film which causes the warping is cut at the positions of the separation grooves, and the stress which the thin film gives to the substrate is cut at the positions of the separation grooves, decreasing the stress that warps the wafer. This not only decreases the defect of cracking of the semiconductor wafer in the step of grinding and/or polishing the back surface of the substrate after the step of forming the separation grooves but also makes it possible to uniformly machine the whole back surface of the substrate and, hence, to obtain a semiconductor wafer having a uniform thickness.

When the thickness of the semiconductor wafer is not uniform, the neighboring chips irregularly rub each other at the time of dividing into the chips because the separation grooves have bending points, and there locally occur cuts and scars on the end surfaces of the chips. Therefore, the separation grooves scribed prior to the step of decreasing the thickness of the substrate should desirably have a depth reaching the substrate.

The back surface of the substrate may be ground and polished by any known method. Among them, it is desired to effect the grinding and polishing by using abrasive particles such as diamond.

The step of division into individual chips is conducted by imparting stress by using rollers to the semiconductor wafer obtained through the first to third steps thereby to generate cracks from the separation grooves through up to the interior of the substrate.

When the chips are of a square form, the chips can be divided by a breaker using a notch. In the case of a chip which is pentagonal or more highly polygonal, however, use of a notch which exerts the stress onto the linear region of the semiconductor wafer causes defects such as cutting-away to a large extent. Similarly, the dividing method which linearly scribes a polygonal line also causes defects such as cutting-away. Therefore, the semiconductor wafer to be divided into chips should desirably have a small thickness.

When the semiconductor wafer has a large thickness, it is desired that the chips are divided by placing the semiconductor wafer on a spherical metal mold which can divided the wafer into the individual chips in a direction in which the gap among the neighboring chips increase. When the spherical metal mold is used, it is desired that the thickness of the semiconductor wafer is not smaller than about 90 μm but is not larger than 150 μm and that the depth of the separation grooves is about 15 μm to about 20 μm.

When the semiconductor wafer is thin, stress is imparted by using rollers to generate cracks in the substrate so as to be divided into chips. When the semiconductor wafer has a thickness of not larger than 100 μm and the separation grooves have a depth of not smaller than 15 μm, stress is imparted by using rollers to divide the wafer into chips. To decrease the probability of defects such as scars, it is necessary to further increase the margin.

When the semiconductor wafer is thinner, division into chips can be accomplished even by using a chip breaker using a notch. By optimizing the shape of notch end of the chip breaker and the stress exerted on the notch so that stress can be uniformly applied over a wide region like the roller, division into chips can be accomplished by using the chip breaker even when the semiconductor wafer has a thickness of about 100 μm.

The thus obtained polygonal chip having five or more corners exhibits better light extraction efficiency at the ends of the chip than the conventional square chips. A face-up type chip may be formed by adhering the substrate side to the lead frame by using a silver paste or an epoxy resin and by bonding wires to both the positive and negative electrodes. Or, a flip-chip type chip may be formed by adhering both the positive and negative electrodes to the lead frame via an electrically conducting material such as solder. A lead frame mounting the chip can be molded with a resin to use it as a very bright blue or green lamp. Or, a light energy conversion material such as a fluorescent material may be arranged surrounding the chip to use it as a very bright white lamp. In this case, it is advantageous to arrange the light energy conversion material in an amount larger near the ends than at the center of the chip to effectively utilize light emitted from the ends of the chip. Moreover, a variety of designs can be accomplished by taking into consideration the shape of the lead frame and the distribution of light emitted from the lamp.

EXAMPLES

The invention will now be concretely described by way of Examples to which, however, the invention is in no way limited.

Example 1

Figure 5:
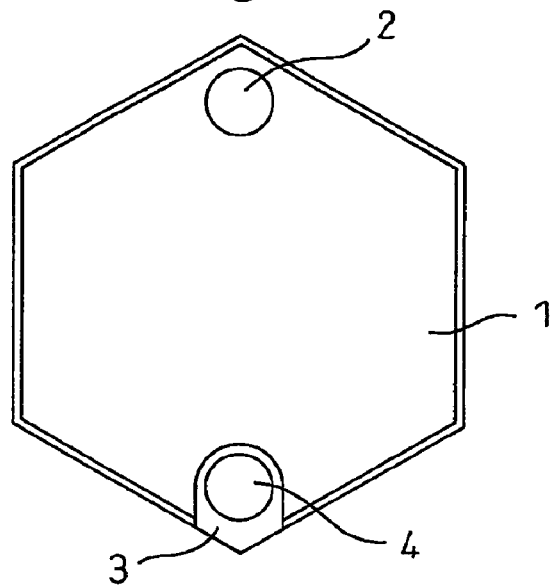
FIG. 5 is a plan view of a light-emitting device fabricated in Example 1.

A blue light-emitting device comprising a Group III nitride semiconductor having an orthohexagonal chip form was fabricated in a manner as described below. FIG. 5 is a plan view of a light-emitting device fabricated in this example, wherein reference numeral 1 denotes a p-electrode, 2 denotes a p-electrode bonding pad, 3 denotes an n-type exposed surface and reference numeral 4 denotes an n-electrode.

A Group III nitride semiconductor stacked layer structure was formed by successively stacking, on a sapphire substrate having a diameter of 5.1 cm (2 inches) and a thickness of 420 μm and via a buffer layer of AlN, an underlying layer of undoped GaN having a thickness of about 4 μm, an n-side contact layer of Ge-doped (concentration of $1\times10^{19}/cm^3$) GaN having a thickness of about 2 μm, an n-side clad layer of Si-doped (concentration of $1\times10^{18}/cm^3$) $In_{.1}Ga_{.9}N$ having a thickness of about 12.5 nm, a light-emitting layer of a multiple quantum well structure, in which a barrier layer of GaN having a thickness of about 16 nm and a well layer of $In_{0.2}Ga_{0.8}N$ having a thickness of about 2.5 nm were stacked five times alternately and finally the barrier layer was further stacked, a p-side clad layer of Mg-doped (concentration of $1\times10^{20}/cm^3$) $Al_{0.07}Ga_{0.93}N$ having a thickness of about 2.5 ran and a p-side contact layer of Mg-doped (concentration of $8\times10^{19}/cm^3$) $Al_{0.02}Ga_{0.98}N$ having a thickness of about 0.16 μm by an MOCVD method.

On the p-side contact layer of the Group III nitride semiconductor stacked layer structure, there was formed a light-transmitting p-electrode having a structure of laminating a Pt layer and an Au layer successively from the side of the p-side contact layer on a predetermined position relying upon a photolithography technology and a lift-off technology. Then, relying upon the photolithography technology, there was formed a p-electrode bonding pad having an Au/Ti/Al/Ti/Au layer structure from the semiconductor side.

Next, relying upon the photolithography technology and the reactive ion etching technology, the n-side contact layer was exposed by etching, and a surface for forming n-electrode was formed in a semicircular shape by etching. Next, an n-electrode of a Cr/Ti/Au three-layer structure was formed on the n-electrode forming surface by a method known to people skilled in the art.

The thus obtained Group III nitride semiconductor wafer was put to the step of cutting. First, a water-soluble resist was uniformly applied by using a spin coater onto the whole surface on the semiconductor layer side of the wafer, and was dried to form a protection film having a thickness of about 0.2 μm so that contaminant due to the cutting will not adhere onto the Group III nitride semiconductor layer at the time of machining with a laser.

Next, a UV tape was stuck to the sapphire substrate side of the wafer and was fixed by a vacuum chuck onto a stage of a pulse laser machining apparatus. The stage was of a rotary structure which was controlled by a computer to move in the X-axis (right and left) and in the Y-axis (back and forth) directions. After being fixed to the vacuum chuck, a laser optical system was so adjusted that the focal point of laser was on the surface of the protection film, and separation grooves were formed by the irradiation with a laser beam as shown in FIG. 1 so as to traverse the semiconductor wafer to, first, form a polygonal line (A1) having the same length of sides with an angle of 120 degrees. Next, separation grooves were formed to describe a polygonal line (A2) which was a parallel translation of the polygonal line (A1). This was repeated to form separation grooves of the form of the polygonal line over the whole surface of the semiconductor wafer. Next, as shown in FIG. 2, every other bending point of the polygonal line was selected and was connected to a bending point of the neighboring polygonal line which was a parallel translation to form separation grooves as represented by straight lines (B). Separation grooves were further formed as represented by straight lines (C) by connecting the bending points that were not selected to the bending points of a neighboring polygonal line moved in parallel toward the opposite side. Thus, there were formed separation grooves of a honeycomb hexagonal chip form with a side of 300 μm on the semiconductor wafer. The thus formed separation grooves had depth of about 30 μm and a width of about 10 μm, and the sapphire substrate was exposed. The separation grooves possessed a V-shape in cross section. After the separation grooves had been formed, the vacuum chuck was released, and the wafer was stripped off the stage. Next, the wafer was set on a stage of the washing machine, and the protection film was removed therefrom, by flowing water, while rotating the wafer.

Next, the back surface of the sapphire substrate of the wafer was ground and polished to form a thin plate of a thickness of about 80 μm. The wafer was divided by the application of stress by using rollers to obtain orthohexagonal chips in a number of about 7000. Those without defective appearance were taken out to obtain an yield of about 80%.

An obtained chip was placed on a lead frame with the sapphire substrate being on the lower side, and was fixed with an adhesive. The n-electrode was connected to the first lead frame, and the p-electrode bonding pad was connected to the second lead frame using gold wires, respectively, to pass a device drive current into the chip. Further, the whole body was molded with a transparent epoxy resin to obtain an LED lamp. The LED lamp was measured by using an integrating sphere to find that the light-emitting output was 7.3 to 8.1 mW with a current of 20 mA.

Example 2

A blue light-emitting device comprising a Group III nitride semiconductor was fabricated in a manner as described below. The form thereof on a plane was the same as that of Example 1.

A Group III nitride semiconductor stacked layer structure was formed by successively stacking, on a sapphire substrate having a diameter of 5.1 cm (2 inches) via a buffer layer of AlN, an underlying layer of undoped GaN having a thickness of about 4 μm, an n-side contact layer of Ge-doped (concentration of $1 \times 10^{19}/cm^3$) GaN having a thickness of about 2 μm, an n-side clad layer of Ge-doped (concentration of about $1 \times 10^{18}/cm^3$) $In_{.1}Ga_{.9}N$ having a thickness of about 12.5 nm, a light-emitting layer of a multiple quantum well structure, in which a barrier layer of GaN having a thickness of about 16 nm and a well layer of $In_{0.2}Ga_{0.8}N$ having a thickness of about 2.5 nm were stacked five times alternately and finally the barrier layer was further stacked, a p-side clad layer of Mg-doped (concentration of $1 \times 10^{20}/cm^3$) $Al_{.07}Ga_{.93}N$ having a thickness of about 2.5 nm and a p-side contact layer of Mg-doped (concentration of $8 \times 10^{19}/cm^3$) $Al_{.02}Ga_{.98}N$ having a thickness of about 0.16 μm by an MOCVD method.

On the p-side contact layer of the Group III nitride semiconductor stacked layer structure, there was formed a light-transmitting p-electrode having a structure of laminating a Pt layer and an Au layer successively from the side of the p-side contact layer on a predetermined position relying upon a photolithography technology and a lift-off technology. Then, relying upon the photolithography technology, there was formed a p-electrode bonding pad having an Au/Ti/Al/Ti/Au layer structure from the semiconductor side.

Next, relying upon the photolithography technology and the reactive ion etching technology, the n-type layer was exposed by etching, and a surface for forming n-electrode was formed in a semicircular shape by etching. At the same time, trenches having a side length of about 300 μm and a groove width of about 18 μm were formed in the form of orthohexagonal chips. The trenches were in a honeycomb pattern of orthohexagons over the whole semiconductor wafer. Next, an insulating film of a silicon oxide was formed on a portion where there were exposed an active layer and a p-type layer surrounding the n-electrode forming surface, and an n-electrode of a Cr/Ti/Au three-layer structure was formed on the n-electrode forming surface by a method known among people skilled in the art.

The thus obtained Group III nitride semiconductor wafer was sent to the step for cutting. First, a water-soluble resist was uniformly applied by using a spin coater onto the whole surface on the semiconductor layer side of the wafer, and was dried to form a protection film having a thickness of about 0.2 μm so that contaminant due to the cutting will not adhere onto the Group III nitride semiconductor layer at the time of machining with a laser.

Next, a UV tape was stuck to the sapphire substrate side of the wafer and was fixed by a vacuum chuck onto a stage of a pulse laser machining apparatus. The stage was of a rotary structure which was controlled by a computer to move in the X-axis (right and left) and in the Y-axis (back and forth) directions. After being fixed to the vacuum chuck, a laser optical system was so adjusted that the focal point of laser was on the surface of the protection film, and separation grooves were formed in the bottom of the trench by the irradiation with a laser beam. The separation grooves were formed by irradiating the trenches with a laser as shown in FIG. 1 so as to traverse the semiconductor wafer to, first, form a polygonal line (A1) having the same length of sides with an angle of 120 degrees. Next, separation grooves were formed describing a polygonal line (A2) which was a parallel translation of the polygonal line (A1). This was repeated to form separation grooves of the shape of the polygonal line over the whole surface of the semiconductor wafer. Next, as shown in FIG. 2, every other bending point of the polygonal line was selected and was connected to a bending point of the neighboring polygonal line which was a parallel translation to form separation grooves as represented by straight lines (B). Separation grooves were further formed as represented by straight lines (C) by connecting the bending points that were not selected to the bending points of a neighboring polygonal line moved in parallel toward the opposite side. Thus, there were formed separation grooves of a honeycomb hexagonal chip form with a side of 300 μm on the trenches of the semiconductor wafer. The thus formed separation grooves possessed a depth of about 25 μm and a width of about 10 μm, and the sapphire substrate was exposed. The separation grooves possessed a V-shape in cross section. After the separation grooves had been formed, the vacuum chuck was released, and the wafer was stripped off the stage. Next, the wafer was set on a stage of the washing machine, and the protection film was removed therefrom, by flowing water, while rotating the wafer.

Next, the back surface side of the sapphire substrate of the wafer was ground to form a thin plate of a thickness of about 80 μm. The wafer was divided by the application of stress by using rollers to obtain orthohexagonal chips in a number of about 7000 as shown in FIG. 5. Those without defective appearance were taken out to obtain an yield of about 80%.

The obtained chips were molded into LED lamps in the same manner as in Example 1 and were evaluated to find that the light-emitting output was 9.3 to 10 mW with a current of 20 mA.

Example 3

In Example 1, the laser beam was irradiated in a manner as described below. Referring to FIG. 4, separation grooves of the same length as the length of a side of a hexagonal chip form were discretely formed like a broken line in a first direction to form separation grooves (E) of the form of a broken line in the first direction. Next, the stage was turned by 60 degrees. Separation grooves of the same length as the length of the side of the hexagonal chip form were formed like a broken line starting from the ends of the separation grooves (E) of the form of a broken line in the first direction, thereby to form separation grooves (F) of the form of a broken line in a second direction. Next, the stage was turned by another 60 degrees. Separation grooves of the same length as the length of the side of the hexagonal chip form were formed like a broken line starting from the ends of the separation grooves (F) of the form of a broken line in the second direction, thereby to form separation grooves (G) in the form of a broken line in a third direction. Thus, there were formed separation grooves to give a honeycomb hexagonal chip form having a side of 300 μm on the semiconductor wafer. The size of the separation grooves and the form thereof in cross section were nearly the same as those of Example 1. The obtained chips were molded into LED lamps like in Example 1 and were evaluated to find that a light-emitting output was 7.3 to 8.1 mW with a current of 20 mA.

Example 4

The semiconductor wafer of Example 2 was ground to possess a thickness of about 80 μm, was placed on a spherical metal mold and was pushed thereon from the upper side so as to be divided into individual chips. The chips without defective appearance were taken out to obtain an yield of about 85%.

Example 5

Orthohexagonal chips were obtained in a number of about 7000 in the same manner as in Example 2 but forming a light-reflecting p-electrode having a structure of laminating a Pt layer and an Rh layer in this order from the side of the p-side contact layer. The chips without defective appearance were taken out to obtain an yield of about 80%.

The n-electrode and the bonding pad of the p-electrode of the obtained chip were connected to the negative electrode and the positive electrode of a sub-mount in which an electric circuit has been incorporated via a solder. The sub-mount was further placed on a lead frame to pass a device drive current to the chip. Further, the whole body was molded with a transparent epoxy resin to obtain an LED lamp. The LED lamp was measured by using an integrating sphere to find that the light-emitting output was 19 to 21 mW with a current of 20 mA.

Example 6

The semiconductor wafer of Example 5 was ground and polished to have a thickness of about 80 μm. Thereafter, second separation grooves of a depth of about 15 μm and a width of about 20 μm were formed by the irradiation with a laser beam at positions on the polished surface side of the substrate corresponding to the positions for forming the separation grooves. The separation grooves possessed nearly a V-shape, and the corners of the substrate were chamfered. The wafer was divided by the application of stress by using rollers to obtain about 7000 orthohexagonal chips. The chips without defective appearance were taken out to find an yield of about 90%.

The obtained chips were molded into LED lamps in the same manner as in Example 5 and were evaluated to find that a light-emitting output was 20 to 23 mW with a current of 20 mA.

Example 7

Figure 3:
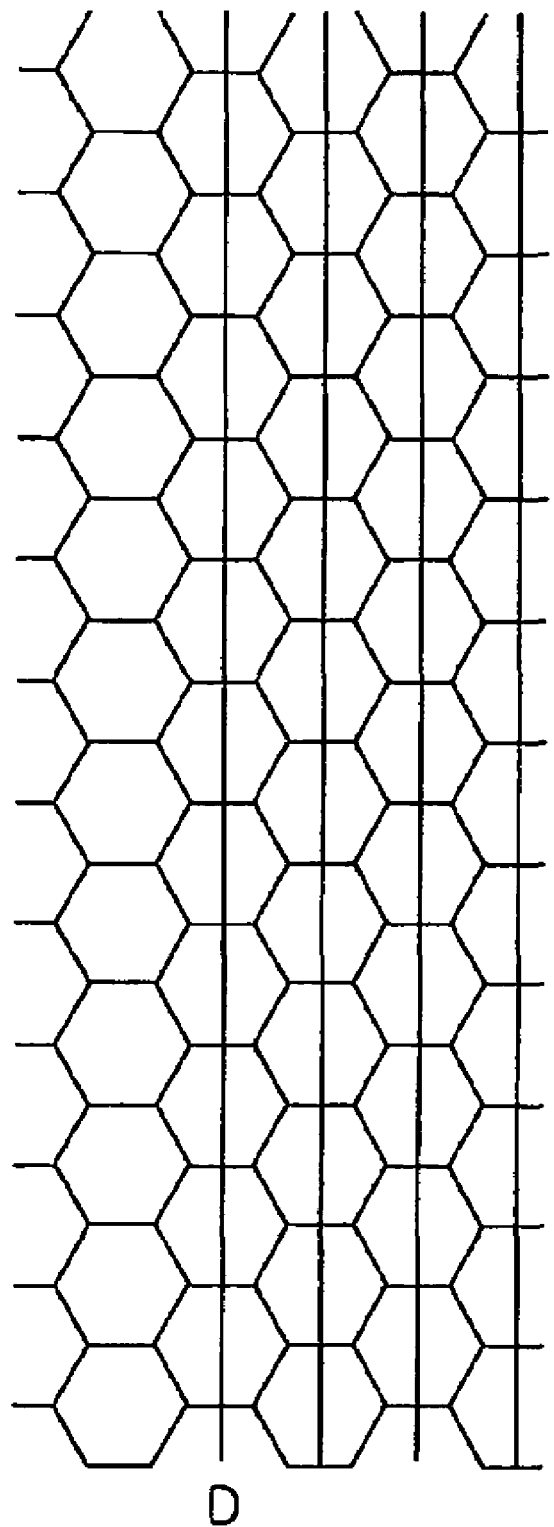
FIG. 3 is a diagram illustrating a procedure for forming separation grooves of pentagonal chips.
Figure 4:
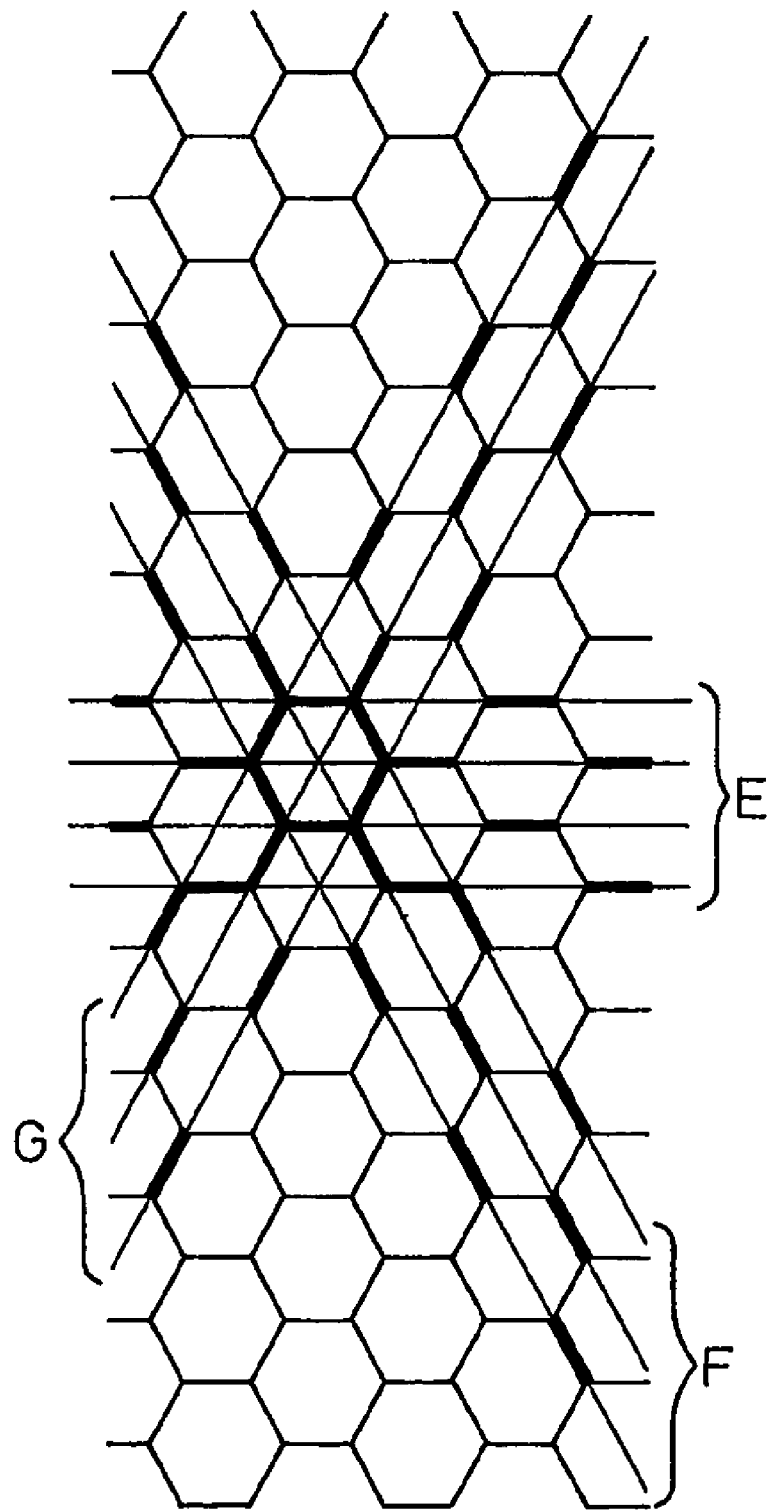
FIG. 4 is another diagram illustrating a procedure for forming separation grooves of hexagonal chips.
Figure 6:
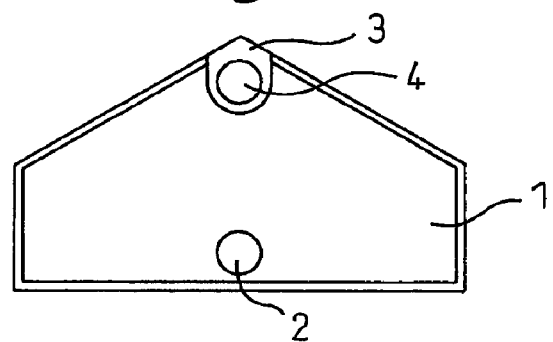
FIG. 6 is a plan view of a light-emitting device fabricated in Example 7.

Chips of a pentagonal shape form were obtained in a number of about 14,000 in the same manner as in Example 1 with the exception of forming separation grooves for obtaining pentagonal chips shown in FIG. 6 by forming a separation groove of a straight line (D) shown in FIG. 3 after formation of separation grooves of the form of straight lines (C) shown in FIG. 2. Chips without defective appearance were taken out to obtain an yield of about 80%.

The obtained chips were molded into LED lamps in the same manner as in Example 1 and were evaluated to find that the light-emitting output was 3.5 to 3.8 mW with a current of about 20 mA.

Example 8

Figure 7:
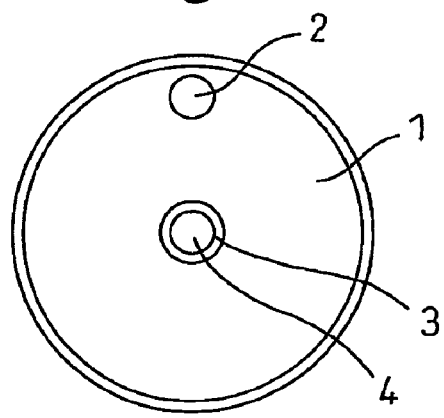
FIG. 7 is a plan view of a light-emitting device fabricated in Example 8.

A light-emitting device was fabricated according to the same procedure as that of Example 1 but by so forming the separation grooves that the chip possessed a circular shape of a radius of 275 μm. As there existed a region that could not be used as a light-emitting device between the circles, the effective area for use as the chip was about 80% as compared to that of the case of the orthohexagonal shape. Referring to FIG. 7, the electrode shape was such that the n-electrode forming surface (3) was at the central portion of the chip surrounded by the arrangement of p-electrode (1). Circular chips were obtained in a number of about 6,000 according to the procedure of Example 1. The chips without defective appearance were taken out to obtain an yield of about 70%.

The obtained chips were molded into LED lamps in the same manner as in Example 1 and were evaluated to find that the light-emitting output was 8.1 to 8.3 mW with a current of 20 inA.

INDUSTRIAL APPLICABILITY

The compound semiconductor light-emitting device obtained according to the present invention exhibits a good current distribution, can be easily applied even to a large chip, helps improve the light extraction efficiency on the side surfaces of the chip, and offers an increased degree of freedom in the arrangement of chips that are mounted, presenting a very great value for the utilization, particularly, in the lighting industries. Besides, the chips can be taken out from the substrates maintaining an improved yield and can be produced in large quantities at a decreased cost.

The invention claimed is:

1. A method of producing a Group III nitride semiconductor device having a chip shape which is a pentagonal or more highly polygonal shape, comprising a first step of epitaxially growing a Group III nitride semiconductor on a substrate to form a semiconductor wafer; a second step of irradiating said semiconductor wafer with a laser beam to form separation grooves; a third step of grinding and/or polishing the main surface side different from the epitaxially grown main surface of the substrate; and a fourth step of division into individual chips by applying stress to said separation grooves, wherein the second step irradiates the laser beam from the semiconductor side of the semiconductor wafer, and after the second step, further including a fifth step of forming trenches, in which at least the n-type layer is exposed, being corresponded to the positions for forming the separation grooves.

2. A method of producing a Group III nitride semiconductor device according to claim 1, wherein the first step, the second step, the third step and the fourth step are included in this order.

3. A method of producing a Group III nitride semiconductor device according to claim 1, wherein the separation grooves are at least partly reaching the substrate.

4. A method of producing a Group III nitride semiconductor device according to claim 1, wherein the second step comprises a step of irradiating a laser beam from the semiconductor side of the semiconductor wafer and a step of irradiating a laser beam from the substrate side of the semiconductor wafer.

5. A method of producing a Group III nitride semiconductor device according to claim 1, wherein the separation grooves have a V-shape in the cross section.

6. A method of producing a Group III nitride semiconductor device according to claim 1, wherein the thickness of the semiconductor wafer is ground and/or polished at the third step to be not larger than 150 μm.

7. A method of producing a Group III nitride semiconductor device according to claim 1, wherein the fourth step is executed by pushing the substrate onto a spherical metal mold.

8. A method of producing a Group III nitride semiconductor device according to claim 1, wherein the chip shape is substantially an orthohexagonal shape.

9. A method of producing a Group III nitride semiconductor device according to claim 1, wherein the chip shape is substantially a pentagonal shape.

10. A method of producing a Group III nitride semiconductor device according to claim 1, wherein the chip is substantially of a circular form.

11. A method of producing a Group III nitride semiconductor device according to claim 1, wherein the Group III nitride semiconductor device is a light-emitting device.

12. A method of producing a Group III nitride semiconductor device according to claim 11, wherein the first step forms the semiconductor wafer by epitaxially growing an n-type layer, a light-emitting layer and a p-type layer comprising the Group III nitride semiconductor in this order on the substrate.

13. A method of producing a Group III nitride semiconductor device having a chip shape which is a pentagonal or more highly polygonal shape, comprising a first step of epitaxially growing a Group III nitride semiconductor on a substrate to form a semiconductor wafer; a second step of irradiating said semiconductor wafer with a laser beam to form separation grooves; a third step of grinding and/or polishing the main surface side different from the epitaxially grown main surface of the substrate; and a fourth step of division into individual chips by applying stress to said separation grooves, wherein the second step forms a separation groove of the form of a polygonal line that is bent, forms a plurality of separation grooves of the form of a polygonal line that is bent in a form of being translated in parallel and, then, forms linear separation grooves by connecting every other bending points of the neighboring separation grooves of the form of a polygonal line.

14. A method of producing a Group III nitride semiconductor device having a chip shape which is a pentagonal or more highly polygonal shape, comprising a first step of epitaxially growing a Group III nitride semiconductor on a substrate to form a semiconductor wafer; a second step of irradiating said semiconductor wafer with a laser beam to form separation grooves; a third step of grinding and/or polishing the main surface side different from the epitaxially grown main surface of the substrate; and a fourth step of division into individual chips by applying stress to said separation grooves, wherein the second step forms first separation grooves of the form of a broken line, forms second separation grooves of the form of a broken line that intersect the first separation grooves of the form of the broken line at a first angle, and forms third separation grooves of the form of a broken line that intersect the second separation grooves of the form of the broken line at a second angle and further intersect the first separation grooves of the form of the broken line at a third angle, the sum of the first angle, the second angle and the third angle being 180 degrees.

15. A method of producing a Group III nitride semiconductor device having a chip shape which is a pentagonal or more highly polygonal shape, comprising a first step of epitaxially growing a Group III nitride semiconductor on a substrate to form a semiconductor wafer; a second step of irradiating said semiconductor wafer with a laser beam to form separation grooves; a third step of grinding and/or polishing the main surface side different from the epitaxially grown main surface of the substrate; and a fourth step of division into individual chips by applying stress to said separation grooves, wherein the chip shape is substantially a pentagonal shape and the second step forms separation grooves of the hexagonal shape by forming separation grooves of the form of a polygonal line that is bent, forming separation grooves of the form of a plurality of polygonal lines that are bent in a form of being translated in parallel and, then, forming linear separation grooves by connecting every other bending points of the neighboring separation grooves of the form of polygonal lines and, further, forms linear separation grooves connecting the opposing two sides of the separation grooves of said hexagonal form.

16. A method of producing a Group III nitride semiconductor device having a chip shape which is a pentagonal or more highly polygonal shape, comprising a first step of epitaxially growing a Group III nitride semiconductor on a substrate to form a semiconductor wafer; a second step of irradiating said semiconductor wafer with a laser beam to form separation grooves; a third step of grinding and/or polishing the main surface side different from the epitaxially grown main surface of the substrate; and a fourth step of division into individual chips by applying stress to said separation grooves, wherein the chip shape is substantially a pentagonal shape and the second step forms separation grooves of the form of the hexagonal shape by forming first separation grooves of the form of a broken line, forming second separation grooves of the form of a broken line that intersect the first separation grooves of the form of the broken line at a first angle, and forming third separation grooves of the form of a broken line that intersect the second separation grooves of the form of the broken line at a second angle and further intersect the first separation grooves of the form of the broken line at a third angle, the sum of the first angle, the second angle and the third angle being 180 degrees and, further, forms linear separation grooves connecting the opposing two sides of the separation grooves of said hexagonal form.

* * * * *